United States Patent [19]

Davis

[11] 4,210,383

[45] Jul. 1, 1980

[54] CIRCUIT TEST CLAMP

[76] Inventor: David E. Davis, 1739 Grand Teton Dr., Milpitas, Calif. 95035

[21] Appl. No.: 18,467

[22] Filed: Mar. 7, 1979

[51] Int. Cl.² .......................................... H01R 11/22
[52] U.S. Cl. .............................. 339/200 P; 339/255 P
[58] Field of Search ............... 339/200 P, 203, 255 P, 339/260, 261, 108 TP

[56] References Cited

U.S. PATENT DOCUMENTS 3,899,239  8/1975  Allard ................................ 339/255 P
4,116,518  9/1978  Pleskac ............................. 339/255 P Primary Examiner—Joseph H. McGlynn

[57] ABSTRACT

A circuit test clamp for testing integrated circuit modules having a recess extending transversely across each body member exposing the conductive elements within them, and a projection extending outwardly from the eyelet disposed at one end of each conductive element, the base of the eyelet being embedded within its' body member, thereby permitting the simultaneous attachment of multiple leads from several test equipments and enhanced structural support of the eyelet.

4 Claims, 3 Drawing Figures

CIRCUIT TEST CLAMP

BACKGROUND OF THE INVENTION

This invention relates generally to test fixtures and more particularly relates to a clamp for testing miniaturized circuits such as integrated circuit modules (ICs).

Integrated circuit test clamps are well known and widely used in the electronics industry. Examples of such devices are U.S. Pat. Nos. 3,506,949 (Venaleck) and 3,899,239 (Allard). However, such devices suffer limitations which this invention is designed to correct.

The most common and reliable ways of testing integrated circuits are with digital logic analyzers, oscilloscopes and voltage probes. Often it is necessary to simultaneously examine the output from an IC pin with more than one test device and/or to simultaneously utilize more than one output from an IC pin. The configuration of existing IC test clamps prevents the attachment of more than one equipment test lead to a pin position at a time.

Current technology minimizes spacing between ICs on circuit boards. Often it is necessary to simultaneously test adjacent IC modules. Test clamps which have their positive attachment elements extending perpendicularly from the body of the clamp make this difficult, if not impossible. Moreover, the perpendicularly extending elements create a physical obstruction when moving a test lead from one point to another, thereby increasing the likelihood of short-circuiting the IC module or test equipment. Also, perpendicularly extending elements make a test clamp awkward to handle, because it requires application of force near the fulcrum of the test clamp in order to open it, and increases the likelihood of bending the perpendicularly extended attachment elements.

While test clamps having eyelets permit the attachment of spring loaded hook leads, they do not allow the attachment of test leads that use female connectors to attach to the conductive elements extending from the test clamp, such as are commonly used on digital logic analyzers.

Existing test clamps that maximize separation between test leads by staggering the attachment elements at 90° angles require two shapes of conductive elements, thereby increasing manufacturing costs.

By not embedding a part of the eyelet in the body member, a possibility exists that stress from the continual attachment of test leads will cause the eyelet to be broken off, or that normal wear and tear will cause the entire conductive element to rotate within the body member, thereby increasing the likelihood of short circuiting adjacent IC pins or test leads.

SUMMARY OF THE INVENTION

This invention is an improved circuit test clamp for connecting miniaturized circuits, i.e.—integrated circuit modules (ICs), to external test equipment, i.e.—digital logic analyzers, oscilloscopes, voltage probes, etc.

This improved test clamp includes a pair of oppositely disposed support members pivotally connected to one another. Each of the support members carries a plurality of conducting elements extending lengthwise throughout each support member. Jaw-like clamping means adjacent the front end of the support members are urged toward one another by a resilient means coacting with the support members to allow connection to an IC module. The improvements of this invention comprise disposing an eyelet with an outwardly projecting extension at the rear end of each conducting element, and recessing a section of each support member, thereby permitting connection to the test clamp of multiple and varied test equipments. Also, embedding the base of each eyelet in its support member enhances the structural integrity of the conducting elements.

One object of this invention is to provide a circuit test clamp which maximizes the separation of test connections to a miniaturized circuit being tested.

Another object of this invention is to provide a circuit test clamp which permits connecting to a miniaturized circuit without disabling the circuit.

A third object of this invention is to permit the simultaneous attachment of multiple test leads to the miniaturized circuit.

A fourth object of this invention is to permit the concurrent attachment of both spring loaded hook and female lead test connectors to the miniaturized circuit.

A fifth object of this invention is to permit the concurrent testing of closely spaced miniaturized circuits.

A sixth object of this invention is to reduce the manufacturing costs of a circuit test clamp having the feature of maximizing the separation of test connections.

A seventh object of this invention is to lessen the likelihood of breakage or degradation of the circuit test clamp.

DETAILED DESCRIPTION OF THE PREFERRED EMBODIMENT

Figure 1:
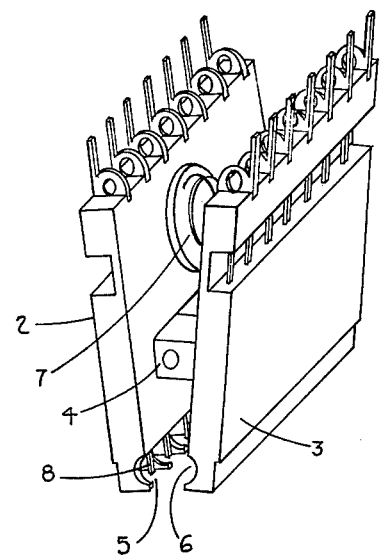
FIG. 1 is a perspective view of the circuit test clamp.

The test clamp of this invention is illustrated in perspective in FIG. 1. This test clamp has a pair of support members 2 and 3, which are pivotally connected to one another at 4. A pair of jaws, 5 and 6, are urged towards one another by resilient means 7. A plurality of conducting elements 8 extend longitudinally throughout the support members, with one end of the elements 8 adapted to engage the leads of a miniaturized circuit at the jaws 5 and 6.

Figure 2:
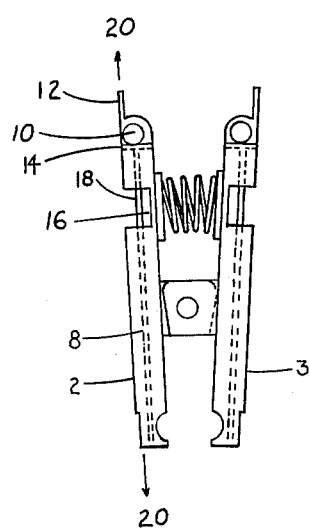
FIG. 2 is a side elevation of the circuit test clamp.

Referring to FIG. 2, the opposite end of the conducting element 8 extends outwardly from the support member 2 to form eyelet 10 and outward projection 12 from the eyelet to provide exposed terminals for the connection of leads from test equipment. Base 14 of eyelet 10 is embedded in support member 2 to enhance structural support. Recess 16 within support member 2 exposes conducting element 8 at point 18. Multiple points for the connection of test equipment at a single test point is thus provided. Support member 3 is preferably of identical configuration and need not be explicitly described.

Figure 3:
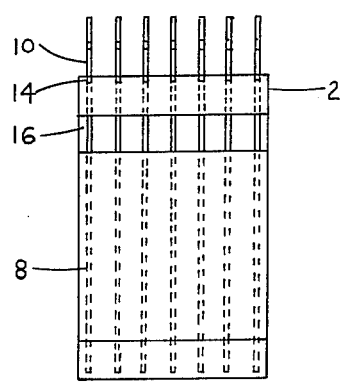
FIG. 3 is a sectional view of the test clamp taken at 20—20 of FIG. 2.

FIG. 3 is a sectional view of support member 2 taken at 20—20 of FIG. 2 and illustrates the exposure of the plurality of parallel conducting elements 8 in recess 16, and base element 14 of eyelet 10 embedded in support member 2. Support member 3 need not be illustrated as it is preferably identical in configuration.

To connect the circuit test clamp to a miniaturized circuit, the upper portion of support members 2 and 3 is squeezed together, opening the jaws 5 and 6, thereby allowing the test clamp to be clamped on the miniaturized circuit.

The terms and expressions which have been used are used as terms of description and not of limitation and there is no intention in the use of such terms and expressions of excluding equivalents of the features shown or described or portions thereof and it is recognized that various modifications may be possible within the scope of the invention claimed.

I claim:

1. An improved test clamp having a pair of oppositely disposed support members pivotally connected to one another, each said support member having a front and rear end, each said support member having a plurality of conducting elements extending longitudinally from a front to rear end of said support members, jaw-like clamping means disposed adjacent the front ends of said support members, and a resilient means coacting with said support members for resiliently urging said jaw-like clamping means towards one another, wherein the improvement comprises:

an eyelet disposed at the rear end of each said conducting element, an outwardly projecting extension from each said eyelet, a recess extending transversely across each said support member exposing each said conducting element.

2. The improved test clamp according to claim 1 wherein the base of each said eyelet is embedded in the rear end of its' support member.

3. The improved test clamp according to claim 1 wherein each said support member is in substantially identical configuration.

4. The improved test clamp according to claim 1 wherein the eyelets are disposed in generally parallel and equally spaced relation to one another.

* * * * *